United States Patent [19]

Chumakov

[11] 4,270,594
[45] Jun. 2, 1981

[54] METHOD AND APPARATUS FOR PRODUCING DIRECTIONALLY SOLIDIFYING CAST PIECES

[76] Inventor: Vasily A. Chumakov, ulitsa Belozerskaya, 3-a, kv. 58, Moscow, U.S.S.R.

[21] Appl. No.: 956,842

[22] Filed: Nov. 2, 1978

[51] Int. Cl.³ .................. B22D 27/20; B22D 25/06
[52] U.S. Cl. ............................ 164/127; 164/338 M; 164/348
[58] Field of Search ............ 164/60, 125, 127, 338 R, 164/338 M, 338 H, 348, 122

[56] References Cited

U.S. PATENT DOCUMENTS

| | | | |
|---|---|---|---|
| 2,951,272 | 9/1960 | Kiesler | 164/80 |
| 3,008,855 | 11/1961 | Swenson | 148/32 |
| 3,677,324 | 7/1972 | Higginbotham et al. | 164/127 X |
| 3,690,367 | 9/1972 | Daniels | 164/348 X |

FOREIGN PATENT DOCUMENTS 1269833  4/1972  United Kingdom .

Primary Examiner—Robert D. Baldwin

[57] ABSTRACT

Foundry moulds are preheated throughout their surface areas, inclusive of bottom portions thereof, prior to being fed to the crystallization zone. Extending through heating, crystallization and cooling zones is a bottom plate formed as a single guide intended for the movement of foundry moulds therealong. The bottom plate is made up of a heated graphite section and of a cooled metallic section with the point of their joining being disposed at the entry to the crystallization zone wherein are arranged heaters movable over the height relative to the bottom plate and interlocked in a manner to permit stepwise control of heating lengthwise of the bottom plate. This makes it possible to enhance production efficiency and improve the quality of directionally solidifying metal castings; it also allows for the continuous production of a plurality of castings having improved quality of structure and requiring no further complicated treatment at the final stage of making a finished product such as turbine blades or permanent magnets.

6 Claims, 3 Drawing Figures

METHOD AND APPARATUS FOR PRODUCING DIRECTIONALLY SOLIDIFYING CAST PIECES

BACKGROUND OF THE INVENTION

1. Field of the Application

The present invention relates to foundry practice, and more particularly to the mass production process of making directionally solidifying cast pieces such as, for example, blades for gas turbines or permanent magnets.

2. Description of the Prior Art

For example, there are known methods for producing directionally solidifying cast pieces from a melt, comprising the steps of heating a foundry mould to a temperature exceeding the melting temperature of a metal, melting down the metal, pouring the molten metal into the foundry mould cavity, and cooling the foundry mould by way of bringing it in contact with the cooled surface of a mould (cf. U.S. Pat. No. 3,008,855 and U.S. Pat. No. 2,951,272).

There is also known a method for producing directionally solidifying cast pieces in movable foundry moulds and an apparatus for effecting same, disclosed in British Pat. No. 1,269,833.

The invention of the patent referred to above provides an apparatus formed with a single-piece rotatable bottom plate with foundry moulds being fixedly mounted over the circumference thereof and conveyed through the zone of crystallization. Arranged in the crystallization zone is a heater creating a heat front diminishing in the travelling direction of the foundry moulds. To enable forced cooling of the foundry moulds rigidly mounted on the rotatable bottom plate, a flow of coolant is supplied to the sections of the bottom plate in contact with the lower end portions of said moulds. Such apparatus construction is disadvantageous in that the foundry mould cannot be heated throughout its surface area to a temperature above the melting temperature of metal; the bottom portion of the foundry mould is always underheated while remaining in constant contact with the cooled surface of the mould. Therefore, a more simple process combining metal melting and pouring operations with the heating of a foundry mould is impossible to carry out, since it requires overheating the molten metal to the temperature substantially above the heating temperature of the foundry mould. This procedure, however, is difficult to carry out in the foundry mould as the latter is concurrently subjected to heating.

The above-mentioned apparatus construction suffers from another disadvantage which lies in that by permitting the casting to be produced in the crystallization zone of a definite height or still smaller than that, the furnace production efficiency will be impaired due to shorter length of heat front actively participating in the crystallization process.

Another disadvantage of the aforesaid apparatus construction lies in that the conveyer transportation of the foundry moulds rigidly fixed on the rotatable bottom plate considerably complicates the process and construction of a unit intended for the sluicing of foundry moulds in the event of carrying out the method for the production of directionally solidifying cast pieces under vacuum which is absolutely necessary in the production of gas turbine blades made of highly oxidizable alloys.

It is therefore an object of the invention to provide a method for producing directionally solidifying cast pieces, which will permit the production efficiency to be enhanced and castings to be continuously produced with high quality of structure and improved mechanical properties.

Another object of the invention is to provide a method for producing cast pieces, which will permit the crystallization process to be regulated in a manner to enable the production of castings having various shapes and dimensions.

Still another object of the invention is to provide an apparatus for carrying into effect the method for producing directionally solidifying cast pieces, which is simple in construction and reliable in operation.

Another object of the invention is to provide an apparatus for producing directionally solidifying cast pieces, which is readily applicable in a mechanized or fully automated production process.

An object of the invention is to provide an apparatus of the type described above, which is suitable for operation under conditions permitting control over the temperature and time interval parameters of the production process, making it possible to attain a maximum production efficiency per unit of the bottom plate surface area.

SUMMARY OF THE INVENTION

These and other objects of the invention are accomplished by the provision of a method for producing directionally solidifying cast pieces, comprising the steps of heating a foundry mould to a temperature above the melting temperature of metal, pouring a metal into the foundry mould cavity, displacing the foundry mould with the metal through the furnace crystallization zone creating a heat front diminishing in the travelling direction of the foundry mould with the metal, and subsequent cooling of the foundry mould with the metal, wherein the improvement, according to the invention, lies in that the foundry mould is heated throughout its surface area inclusive of the bottom portion thereof prior to pouring the metal into the foundry mould cavity, with said bottom portion of the foundry mould being brought in contact with a cooled surface as soon as the foundry mould is fed to the crystallization zone with said diminishing heat front.

Such sequence of operating stages makes it possible to strictly separate the steps of preheating the foundry mould and its cooling in the process of crystallization, as well as to enable uniform heating of the foundry mould cavity throughout its surface area.

According to another embodiment of the invention, the method for producing directionally solidifying cast pieces is characterized in that a pluralty of adjoining foundry moulds pass simultaneously and in parallel through all said operating stages, being subjected to similar heating and cooling conditions.

Such technical improvement allows for the continuous and simultaneous production of a plurality of castings having improved quality.

According to still another embodiment of the invention the method for producing directionally solidifying cast pieces is characterized by that the rate of cooling of the foundry mould with metal is regulated by means of effecting stepwise control of heating in the course of the foundry mould travelling.

The above improvement permits requisite temperature conditions to be established for crystallization process enabling optimal conditions for the formation of the casting structure.

The invention also provides an apparatus for producing directionally solidifying cast pieces in accordance with the method of the invention, comprising successively disposed: a heating zone wherein a foundry mould is heated, a crystallization zone with heaters creating a heat front diminishing in the travelling direction of the foundry mould, and a cooling zone as well as means for filling the foundry mould with molten metal and means for moving foundry moulds through said zones, wherein the improvement lies in that there is provided a bottom plate made as a common guide and extending through all said zones and made up of successively adjoining sections, of a heated section and a cooling one, with the point of joint thereof being at the entry to the crystallization zone, the bottom portions of the foundry moulds made movable along the entire length of said guiding bottom plate in direct thermal contact with said sections thereof.

The apparatus according to the invention is thus rendered most suitable for carrying into effect the method of the invention, featuring simplicity of construction and reliability in operation.

According to another embodiment of the invention, the heated section of the apparatus bottom plate is preferably formed of a refractory material, such as graphite, with the cooled section thereof being formed of a metal having relatively high thermal conductivity.

Such improvement permits high effectiveness to be attained in heating bottom portions of foundry moulds in the course of their travelling along the graphite section of the guiding bottom plate, as well as their rapid cooling at a maximum temperature gradient on the metal section of said bottom plate.

In still another embodiment of the invention, in the crystallization zone above the single-piece cooled section of the bottom plate there are arranged sets of separate heaters and a device for individual vertical displacement of the heaters relative to said cooled section of the bottom plate.

As a result, it becomes possible to effect step-wise control over the heating of foundry moulds in the crystallization zone, making the most of the apparatus according to the invention for producing directionally solidifying cast pieces of any shape and dimension.

BRIEF DESCRIPTION OF THE ACCOMPANYING DRAWINGS

The invention will be further described, by way of example only, with reference to the accompanying drawings, in which.

DETAILED DESCRIPTION OF THE PREFERRED EMBODIMENT

Figure 1:
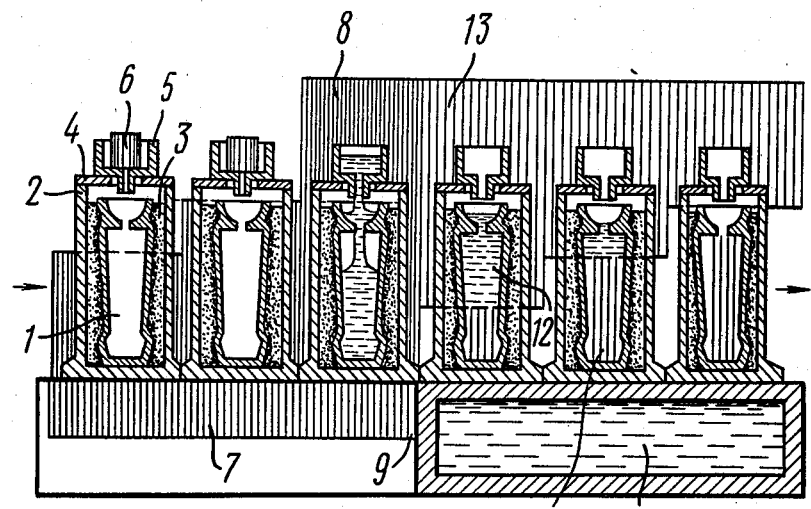
FIG. 1 shows the production flowsheet of making directionally solidifying cast pieces according to the invention.

The method according to the invention for producing directionally solidifying cast pieces is effected in a manner such as shown in FIG. 1, namely:

a ceramic shell having a cavity 1 intended to accommodate a workpiece being cast is placed in a graphite moulding box 2. The interspace between them is filled with a backing sand 3 and is then covered with a cover 4 carrying a ceramic bowl 5 accommodating a solid metal billet 6 made of a nickel-base alloy. The moulding box 2 is caused to move (in the direction indicated in the drawing by arrows) through the heat front created by lateral heaters 7. A foundry mould is first heated primarily at the side of its bottom portion and, after the latter is heated to the temperature above the melting temperature of metal (it being 1350° C. for a nickel-base alloy), the remainder part of the mould and its upper portion are heated to a temperature of 1480° to 1500° C. with the aid of additional heaters 8.

Before the foundry mould is brought to the crystallization zone, the molten metal drains into the foundry mould cavity. At the entry to the crystallization zone, the base bottom portion of the foundry mould is brought in contact with a cooled surface of a mould 9 cooled by a water coolant 10.

As a result, crystallization nuclei come into being in the overcooled layer of molten metal at the basis of the foundry mould cavity, which continue to grow into columnar grains 11 from a melt 12. A diminishing heat front 13, established in the crystallization zone along the travelling direction of the foundry mould, enables further growth of the columnar grains 11 until complete solidification of the casting as a whole.

Figure 2:
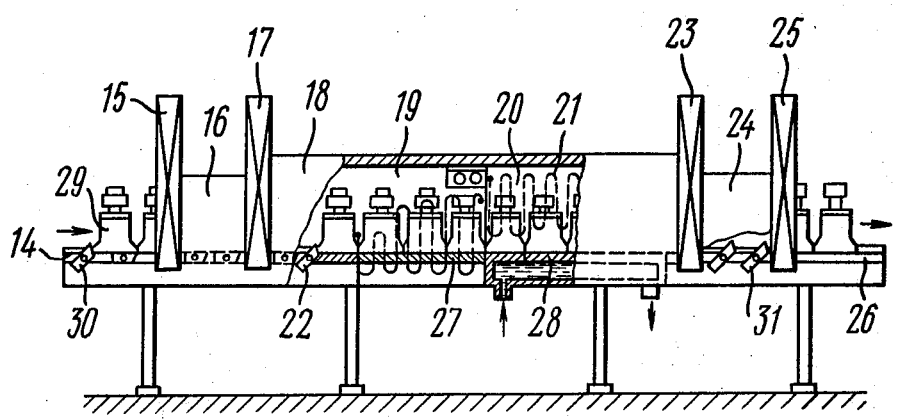
FIG. 2 is a view of an embodiment of the invention for producing directionally solidifying cast pieces, according to the invention.

FIG. 2 shows the apparatus according to the invention for carrying out the method of the invention, comprising a charging table 14, a gate valve 15, a sluice chamber 16, a gate valve 17, a working chamber 18 wherein is successively arranged a heating zone 19, a crystallization zone 20 with heaters 21 intended to establish a heat front diminishing in the travelling direction of foundry moulds (shown by arrows), a cooling zone (not shown), a mechanism 22 for moving foundry moulds through said zones, a gate valve 23, a sluice chamber 24, a gate valve 25, and a discharging table 26. In addition, the working chamber 18 accommodates a bottom plate made in the form of a single guide extending through all said zones and made up of successively adjoining sections, of a heated section 27 and a cooled section 28, with the point of joining thereof being at the entry to the crystallization zone.

The apparatus of the invention is also provided with supplementary equipment, namely: a vacuum and a hydraulic system, power units, a control board with mnemonic diagram, which are not shown in the drawing.

The apparatus according to the invention operates in the mode of automatic closed cycle in the following manner.

A plurality of foundry moulds 29 charged with metal are placed on the charging table 14 and are then moved therefrom by means of a charging mechanism 30 to the sluice chamber 16, with the gate valve 15 being open, wherein they are automatically evacuated. With the pressure in the chambers 16 and 18 being equalized, the foundry moulds are transferred by a similar mechanism to the working chamber 18 wherein they are displaced by the actuating mechanism 22, operating intermittently within a time period of 6 to 15 min. depending on the size of pieces being cast, through all aforesaid zones in a manner described above. The foundry moulds with cast pieces, cooled down to a temperature of 300° to 400° C., are then automatically discharged through the sluice chamber 24 by means of a mechanism 31, with the gate valve 25 open, onto the discharge table 26.

Figure 3:
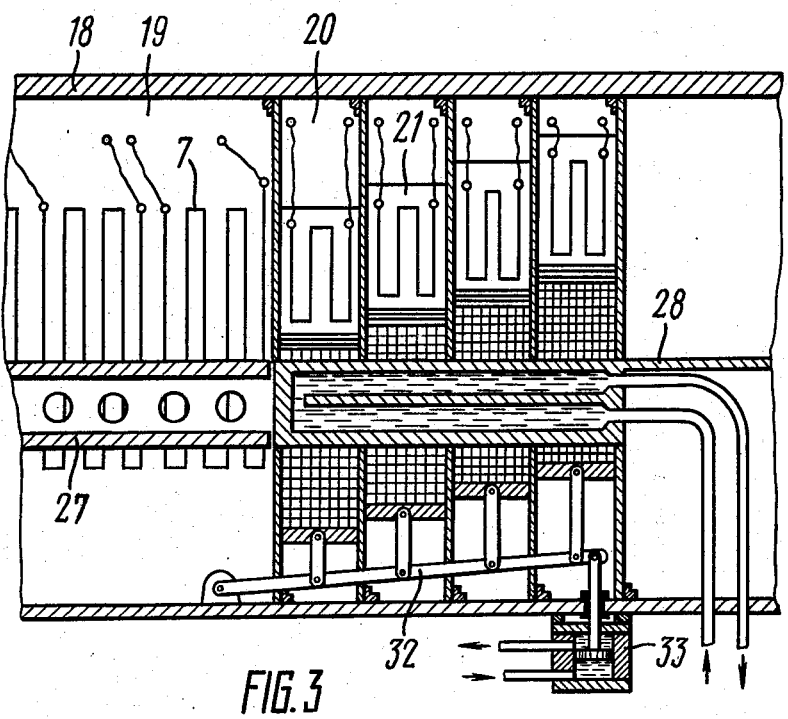
FIG. 3 shows one embodiment of the stepwise heating temperature control in the crystallization zone, effected in the course of travelling of a foundry mould.

Shown in FIG. 3 on a larger scale is the arrangement of heaters in the crystallization zone wherein there is positioned above the bottom plate cooled section 28 sets of individual heaters 21, and a device 32 intended for their individual vertical displacement relative to said cooled section of the bottom plate with the aid of a drive mechanism 33. If necessary, the sets of heaters 21 can be provided with additional or main individual self-controlled actuators connected to a programming unit, not shown in the drawing.

Such construction of the heating unit makes it possible to effect stepwise control over the heating temperature in the course of travelling of the foundry moulds in the crystallization zone and to thereby effect control over the rate of cooling of the foundry moulds filled with metal.

Owing to the possiblity of moving separate units of the heating elements it becomes feasible to produce castings of various shapes and sizes, making the most of the apparatus of the invention.

Due to free movement of a set of foundry moulds along the stationary mounted guiding bottom plate, the sluicing of the foundry moulds at the entry to the working space and at the exit therefrom is effected in the most simple way, the furnace construction is thereby substantially simplified and its operating efficiency and durability is enhanced. Where a central control board with mnemonic diagram is used, the furnace is run by one operator.

The provision of the heated section in the guiding bottom plate permits metal melting operation to be combined with the foundry mould heating, whereby the production process and the furnace construction are simplified.

The use of the moulding box made of graphite ensures unhindered operation of the furnace in the event of accidental break-through of the ceramic shell, which enables its trouble-free operation during a relatively long period of time.

The production output of the presently used vacuum furnaces employed in the mass production of blades for gas turbines ranges from 360 to 480 pieces per 24 hours in the course of non-stop round-the-clock operation.

The above mentioned production output can be increased 1.5 to 2 times due to certain improvements in the production process, and also by increasing the length of the crystallization zone and by raising power capacity of the heating system.

What is claimed is:

1. A method for producing directionally solidifying cast pieces, comprising the steps of providing a bottom plate mould guide madeup of a heated section adjoining a cooled section, heating a foundry mould on said heated section to a temperature above the melting temperature of a metal, pouring the metal into the foundry mould cavity, moving the foundry mould with molten metal through a crystallization zone creating a heat front diminishing in the travelling direction of the foundry mould with metal, and subjecting the foundry mould with metal to complete cooling, wherein said foundry mould is heated throughout its surface area inclusive of the base bottom portion thereof prior to pouring the metal into the foundry mould cavity, with said bottom portion of the foundry mould being brought into contact with said cooled section as soon as the foundry mould is fed to the crystallization zone with said diminishing heat front.

2. A method for producing directionally solidifying cast pieces as claimed in claim 1, wherein a plurality of adjoining foundry moulds are passed simultaneously and in parallel through all said operating stages, being subjected to similar heating and cooling conditions.

3. A method for producing directionally solidifying cast pieces as claimed in claim 1, wherein the rate of cooling of the foundry mould with metal is regulated by stepwise control of heating in the course of travelling of the foundry mould.

4. An apparatus for producing directionally solidifying cast pieces, comprising, successively disposed: a heating means creating a zone wherein a foundry mould is heated, a crystallization means with heaters arranged therein and creating a heat front diminishing in the travelling direction of the foundry mould, means for pouring a molten metal into the foundry mould and means for displacing foundry moulds through said zone; a plurality of bottom elements made as a common guide and extending through all said heating means and said crystallization means and made up of successively adjoining sections defining a heated section and a cooled section, with the point of connection thereof beng disposed at the entry to the crystallization means, the bottom portions of the foundry molds adapted to be movably disposed along the entire length of said guiding bottom elements in direct thermal contact with said sections thereof and means for cooling the bottom elements forming said cooled section.

5. An apparatus for producing directionally solidifying cast pieces as claimed in claim 4, wherein said heated section of the bottom plate is formed of a refractory material, the cooled section thereof being formed of a metal having a relatively high thermal conductivity.

6. An apparatus for producing directionally solidifying cast pieces as claimed in claim 4, wherein arranged in said crystallization zone above the bottom plate cooled section are sets of individual heaters and a device for individual displacement of the heaters over the height relative to said cooled section of the bottom plate.

* * * * *